(12) United States Patent
Vereecken (10) Patent No.: US 7,897,494 B2
(45) Date of Patent: Mar. 1, 2011

(54) FORMATION OF SINGLE CRYSTAL SEMICONDUCTOR NANOWIRES

(75) Inventor: Philippe M. Vereecken, Liège (BE)

(73) Assignee: IMEC, Leuven (BG)

( * ) Notice: Subject to any disclaimer, the term of this patent is extended or adjusted under 35 U.S.C. 154(b) by 120 days.

(21) Appl. No.: 12/490,189

(22) Filed: Jun. 23, 2009

(65) Prior Publication Data

US 2010/0075486 A1 Mar. 25, 2010

Related U.S. Application Data

(60) Provisional application No. 61/075,141, filed on Jun. 24, 2008.

(51) Int. Cl.
*H01L 21/20* (2006.01)
(52) U.S. Cl. .......... 438/486; 257/E21.09; 257/E21.171; 438/502; 977/762; 977/813
(58) Field of Classification Search ............ 257/E21.09, 257/21.171; 438/486, 502; 977/762, 813
See application file for complete search history.

(56) References Cited

U.S. PATENT DOCUMENTS

2007/0232007 A1 10/2007 Forbes

FOREIGN PATENT DOCUMENTS

| | | |
|---|---|---|
| EP | 1700935 A1 | 9/2006 |
| JP | 2007216369 * | 8/2007 |
| WO | WO 2006/046178 A1 | 5/2006 |

OTHER PUBLICATIONS

Liu et al., Japanese Journal of Applied Physics vol. 46, No. 9B, 2007, pp. 6343-6345.
Landholt, D. "Electrochemical and Materials Science Aspects of Alloy Deposition", Electrochimica Acta, vol. 39, 1075-1090, 1994.
Landolt, D., "Electrochemical and Materials Science Aspects of Alloy Deposition", Electrochimica Acta, vol. 29, No. 8/9, pp. 1075-1090, 1994.
Liu et al., "Growth of amorphous silicon nanowires", Chemical Physics Letters 341 (2001) 523-528.
Liu et al., "Low Temperature Synthesis of Single Crystalline Silicon Nanowires Using Anodic Aluminum Oxide Template", Japanese Journal of Applied Physics, vol. 46, No9B, 2007, pp. 6343-6345.

* cited by examiner

*Primary Examiner*—Asok K Sarkar
(74) *Attorney, Agent, or Firm*—Knobbe Martens Olson & Bear LLP (57) ABSTRACT

A method is provided for growing mono-crystalline nanostructures onto a substrate. The method comprises at least the steps of first providing a pattern onto a main surface of the substrate wherein said pattern has openings extending to the surface of the substrate, providing a metal into the openings of the pattern on the exposed main surface, at least partly filling the opening with amorphous material, and then annealing the substrate at temperatures between 300° C. and 1000° C. thereby transforming the amorphous material into a mono-crystalline material by metal mediated crystallization to form the mono-crystalline nanostructure.

17 Claims, 4 Drawing Sheets

FORMATION OF SINGLE CRYSTAL SEMICONDUCTOR NANOWIRES

CROSS-REFERENCE TO RELATED APPLICATIONS

This application claims the benefit under 35 U.S.C. §119(e) of U.S. provisional application Ser. No. 61/075,141, filed Jun. 24, 2008, the disclosure of which is hereby expressly incorporated by reference in its entirety and is hereby expressly made a portion of this application.

FIELD OF THE INVENTION

Methods for formation of single crystal nanowires, e.g., having an n-type and/or p-type dopant, are provided, as are methods for formation of segmented nanowires having segments (regions) containing different dopant types or segments (regions) containing different nanowire material.

BACKGROUND OF THE INVENTION

Nanostructures such as NanoWires (NW) and Carbon Nanotubes (CNT) have been identified as one of the most promising candidates to extend and even replace materials currently used in microelectronic manufacturing processes. For example, metallic CNT have been proposed as nanoelectronic interconnects due to their high current carrying capacity, whereas semiconducting NanoWires (NW) have been indicated as nanoscale transistor elements due to the possibility of forming wrap-around gates and exploitation of quantum confinement effects in the narrow wires. These and similar applications cannot be fully accomplished yet since the fabrication of nanostructures still faces a variety of unsolved issues, which vary from one application to another but may, however, be similar in some aspects as discussed below.

Vapor-liquid-solid (VLS) growth is one of the most common methods used to synthesize NW connecting with other components in a semiconductor device. However, the growth temperature for NW in a chemical vapor deposition (CVD) chamber is typically around 600° C.-700° C. which is relatively high. This high temperature can readily damage the underneath device layer. Therefore, to reduce the growth temperature and at the same time to synthesize a crystalline structure is an important issue.

Liu et al. [Japanese Journal of Applied Physics Vol. 46, No. 9B, 2007, pp. 6343-6345] describes a VLS based growth technique making use of an Anodic Anodized Oxide (AAO) template and Au nanoparticles as catalyst to form silicon nanowires inside the AAO template. By using the AAO template the growth temperature could be lowered to 400° C.-550° C. because the alumina in the AAO template acts as an extra catalyst in addition to the Au catalyst particles.

Another issue is the growth of segmented NW, e.g. a NW having a first segment made of a first semiconducting material and a second segment made of a second semiconducting material. A VLS based growth technique is suitable to achieve e.g. segmented III-V nanowires, but as mentioned above this technique requires relative high growth temperatures (e.g. in the range of 600° C.-700° C.).

Still another issue is the controlled doping of the (semiconducting) NW. It is difficult to control the dopant concentration in the NW and to obtain in a NW low dopant concentrations of e.g. lower than $10^{17}$ in the nanowire or very high dopant concentrations of e.g. higher than $10^{18}$. Using the VLS technique, one can add dopant gasses to the gas mixture for growth but due to the fact that the doping concentrations in the gas mixture are very low, it is very difficult to control the dopant concentration in the gas-phase versus the incorporated dopant concentration in the nanostructure. Moreover it is hard to obtain high concentration this way.

As a conclusion there still exist a problem in the state of the art to provide an easy controllable growth method, preferably at low temperatures, to obtain mono-crystalline nanostructures which method is capable to incorporate specific concentrations of dopant elements and which method is capable of forming easily segmented nanostructures made of at least two segments made of two different semiconducting materials.

SUMMARY OF THE INVENTION

Methods for forming single-crystal nanowires are provided.

Novel and easy methods to grow NW at low temperatures, i.e. below 500° C. are provided.

A novel and easy growth method is provided to provide doped single-crystal nanostructures wherein the concentration of the dopant elements within the nanostructure is very well controllable. Using the method of the preferred embodiments it is possible to control the concentration of dopant elements in the nanostructure in the range of $10^{13}/cm^3$ up to $10^{21}/cm^3$.

A novel and easy growth method is provided to provide segmented nanostructures or in other words a nanostructure having at least two segments, i.e. a first segment made of a first semiconducting material and a second segment made of a second semiconducting material.

Methods are provided which are scalable and fully compatible with existing semiconductor processing, for example for manufacturing nanodevices. The methods provided herein can be performed on any size of substrate.

Methods are provided which allow the growth of monocrystalline nanostructures with control over the diameter and length of the nanostructures such that predetermined diameter, length and density is obtained.

Methods are provided which allow forming elongated mono-crystalline nanostructures at a predetermined location.

Selected methods of preferred embodiments use a combination of templated electrochemical deposition (ECD) and a novel constrained metal-mediated crystallization (MMC).

In a first aspect, a method is provided for growing monocrystalline nanostructures onto a substrate.

The method comprises at least the steps of:
 first providing a pattern onto a main surface of the substrate wherein the pattern has at least one opening, the opening extending from the surface of the pattern to the main surface of the substrate,
 providing a metal into the at least one opening of the pattern, on the exposed main surface,
 at least partly filling the at least one opening with amorphous material, and
 annealing the amorphous material and the metal, at temperatures between 300° C. and 1000° C. thereby transforming the amorphous material into a mono-crystalline material by metal mediated crystallization to form a mono-crystalline nanostructure, and
 optionally removing the metal compound and/or pattern.

According to preferred embodiments, the substrate or at least the top-layer of the substrate is made of a conductive (metallic) or semi conductive (Si, Ge, III-V semiconductor) material when Electro Chemical Deposition (ECD) is used. The substrate or the top-layer of the substrate may be made of an insulating material when vacuum and physical vapor deposition (PVD) techniques are used to provide the metal compound.

According to preferred embodiments, the pattern has openings extending to the top-layer surface of the substrate, and said top-layer surface of the substrate comprises a (copper) Back End Of Line interconnect structure of a semiconductor device. The openings hence extend towards (copper) interconnect structures.

According to preferred embodiments, the pattern may be a porous pattern such as Anodized Aluminum Oxide (AAO), an oriented zeolite or holes formed in a dielectric such as silicon-oxide, a photoresist pattern, etc.

According to preferred embodiments, providing a pattern may comprise:
  depositing a layer on the main surface of the substrate, and
  forming a pattern into the deposited layer using lithographic patterning and reactive ion etching.

According to preferred embodiments, the pattern has openings extending to the surface of the substrate in the nanometer range, more preferably in the range of 2 nm up to 100 nm.

According to preferred embodiments, the pattern may be a permanent pattern or alternatively a sacrificial pattern.

According to preferred embodiments, the pattern is a sacrificial pattern which is removed after formation of the nanostructures using wet etching or dry etching techniques. The removal technique must be selective towards the pattern and not harm the nanostructures and/or substrate underneath the pattern. In case the pattern is a silicon-oxide such as $SiO_2$, the pattern can be removed using a wet or vapour HF treatment.

According to preferred embodiments the step of providing a metal into the openings of the pattern is performed using electrochemical deposition (ECD) or alternatively by other state of the art techniques such as Chemical Vapour Deposition (CVD) or Physical Vapor Deposition (PVD). The metal is selected for metal-mediated crystallization (MMC) of the amorphous material. Suitable metals are e.g. Au, Ni, Co, In, Ga. The suitable temperature range for MMC is determined by the choice of metal; e.g. the temperature will be lower for low melting point metals such as In, Ga and higher for high temperature melting point materials such as Ni and Co. Also metal alloys may be considered. The metal can thus be a single metal or a metal compound or a metal alloy.

According to preferred embodiments, the metal may contain dopant elements. These dopant elements are selected to dissolve into the amorphous material during MMC anneal to obtain a doped crystalline nanostructure.

According to preferred embodiments the step of partly filling the opening with amorphous material is performed using electrochemical deposition (ECD). The amorphous material may be amorphous Si (a-Si), amorphous Ge (a-Ge), amorphous InSb (a-InSb), amorphous carbon (a-C). Ge and Si are typically electrodeposited from organic or ionic solutions while InSb is typically electrodeposited from aqueous solutions.

According to preferred embodiments, the amorphous material may contain dopant elements. Preferably incorporation of the dopant element in the amorphous material is performed by co-deposition of the dopant element and the amorphous material. Typically P, As, Sb or Bi are used as dopant elements to form an n-type doped (Si) material and B, Al, Ga and In are used as dopant elements to form a p-type doped (Si) material.

To obtain a variation in dopant concentration in a nanostructure according to preferred embodiments, first the amorphous material, e.g. amorphous Si, containing dopant elements, e.g. containing P, is co-deposited in a predetermined thickness, e.g. 50 nm, followed by the deposition of the amorphous material in a predetermined thickness, e.g. 150 nm, without any dopant elements. A doping "profile" may be achieved during the crystallization step of the preferred embodiments and/or by performing a further (additional) annealing step after the crystallization step to achieve a doping profile.

According to preferred embodiments, annealing the amorphous material and the metal, is performed at temperatures between 300° C. and 1000° C., depending on the metal-amorphous material combination used for MMC. For example, a temperature in the range 300° C.-400° C. may be used for low-melting point metals such as In, a temperature in the range 500° C.-600° C. for metals such as Ni, Fe and Co and a temperature in the range 900° C.-1000° C. for transition metals such as Ti. The annealing is preferably performed for approximately 1 hour in inert atmosphere or in a vacuum atmosphere. Annealing the amorphous material converts the amorphous material into crystalline material, more preferably mono-crystalline material by diffusion of the amorphous material into the metal. Crystallization is happening by segregation and in the crystallization process the metal phase moves through the amorphous phase leaving behind a crystallized phase until the metal finally ends up on top of the formed crystalline nanostructure. The segregating crystalline phase is mono-crystalline due to the confinement of the pore walls or openings, as the typical grain size in bulk MMC is larger than pore diameter or opening diameter. This phenomenon is denoted as constrained metal-mediated crystallization (CMMC).

According to preferred embodiments, the annealing step may be performed by a Rapid Thermal Anneal.

According to preferred embodiments, after the thermal anneal step full crystallization of the amorphous material is obtained and a single crystalline nanostructure (wire) is obtained with the formed metal on top.

According to preferred embodiments, after crystallization of the amorphous material the metal particle may be removed.

In a second aspect, a method is provided for growing segmented crystalline nanostructures onto a substrate.

The method comprises at least the steps of:
  first providing a pattern onto a main surface of the substrate wherein the pattern has at least one opening, the opening extending from the surface of the pattern to the main surface of the substrate,
  providing a metal into the at least one opening of the pattern on the exposed main surface,
  only partly filling the at least one opening with a first amorphous material,
  at least partly filling the remaining part of the at least one opening with a second amorphous material on top of the first amorphous material,
  annealing the first and second amorphous material and the metal compound, at temperatures between 300° C. and 1000° C. thereby transforming the first and second amorphous material into respectively a first and second mono-crystalline material by metal mediated crystallization to form a segmented mono-crystalline nanostructure, and
  optionally removing the metal compound and/or pattern.

According to an alternative method for growing segmented crystalline nanostructures onto a substrate, the method comprises at least the steps of:
  first providing a pattern onto a main surface of the substrate wherein the pattern has at least one opening, the opening extending from the surface of the pattern to the main surface of the substrate, providing a metal into the at least one opening of the pattern, only partly filling the at least one opening with a first amorphous material, annealing the first amorphous material and the metal compound, at temperatures between 300° C. and 1000° C. thereby transforming the first amorphous material into a first mono-crystalline material by metal mediated crystallization, at least partly filling the remaining part of the at least one opening with a second amorphous material on top of the first mono-crystalline material, annealing the second amorphous material and the metal compound, at temperatures between 300° C. and 1000° C. thereby transforming the second amorphous material into a second mono-crystalline material by metal mediated crystallization to form a segmented mono-crystalline nanostructure, and optionally removing the metal compound and/or pattern.

According to preferred embodiments, the method for growing segmented crystalline nanostructures onto a substrate is used to manufacture hetero junctions. Hetero-junctions are made of at least two segments, each segment being formed in another semiconducting material, e.g. first segment made of Si and then a second segment made of Ge.

According to preferred embodiments, the metal used to crystallize the first amorphous material into a first mono-crystalline material is removed after the step of annealing the first amorphous material and a second metal is deposited onto the first mono-crystalline material. Onto said second metal a second amorphous material is deposited and the second metal is then used to crystallize the second amorphous material into a second mono-crystalline material.

According to preferred embodiments, the metal can be a metal alloy made of at least two metals wherein the first metal is chosen such that it selected to crystallize the first amorphous material into a first mono-crystalline material and wherein the second metal is selected to crystallize the second amorphous material into a second mono-crystalline material.

According to preferred embodiments, the metal is mixed with dopant elements to achieve doping of the amorphous material. The dopant elements are incorporated into the amorphous material during crystallization. In this case the metal compound is replaced in between the segments.

According to preferred embodiments, the first amorphous material may be a-Si, a-Ge, a-InSb, or a-C mixed with a small percentage of dopant elements such as P, As, Sb, Bi as n-type dopants for Si and Ge, or B, Al, Ga as p-type dopant elements for Si and Ge, preferentially by electrochemical co-deposition. The second amorphous material may be the same amorphous material as the first amorphous material but mixed with a small percentage of the opposite dopant elements, or the same dopant elements but in different concentration, or no dopant elements to make an intrinsic part.

According to preferred embodiments, the first amorphous material may be a-Si, a-Ge, a-InSb, or a-C mixed with a small (e.g. 1-3 wt %) percentage of dopant elements such as P, As, Sb, Bi as n-type dopants for Si and Ge, or B, Al, Ga as p-type dopant elements for Si and Ge, preferentially by electrochemical co-deposition. The second amorphous material may be a different amorphous material, referred to as hetero-junction, as the first amorphous material with or without incorporated dopant elements.

According to preferred embodiments, the co-deposition technique may comprise alloy co-deposition in which both the metal compound and the dopant element, e.g. B, As, P, or the like, may be deposited from dissolved ions in an electrolyte.

According to other preferred embodiments, the co-deposition technique may comprise particle co-deposition in which dopant elements are nanoparticles which are dispersed in a solution and the metal compound "matrix" is deposited from dissolved metal ions in the solution.

According to preferred embodiments, the step of filling the at least one opening with amorphous material may be performed by electrochemical deposition or by electroless deposition.

The preferred embodiments provide in a further aspect, the use of the methods in the manufacturing process of semiconductor devices.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

All drawings are intended to illustrate some aspects and preferred embodiments. Not all alternatives and options are shown and therefore the invention is not limited to the content of the attached drawings. Like numerals are used to reference like parts in the different figures. The figures may show preferred embodiments.

In the different figures, the same reference signs refer to the same or analogous elements.

DETAILED DESCRIPTION OF THE PREFERRED EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention. The invention will be described by a detailed description of several preferred embodiments. It is clear that other preferred embodiments can be configured according to the knowledge of persons skilled in the art without departing from the true spirit or technical teaching of the invention, the invention being limited only by the terms of the appended claims.

Moreover, the terms top, bottom and the like in the description and the claims are used for descriptive purposes and not necessarily for describing relative positions. It is to be understood that the terms so used are interchangeable under appropriate circumstances and that the preferred embodiments described herein are capable of operation in other orientations than described or illustrated herein.

The term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary preferred embodiments, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that preferred embodiments may be practiced without these specific details. In other instances, well-known methods, structures and techniques have not been shown in detail in order not to obscure an understanding of this description.

With the term nanostructures is meant any two-dimensionally confined piece of solid material in the form of wires (nanowires), tubes (nanotubes), rods (nanorods) and similar elongated substantially cylindrical or polygonal nanostructures having a longitudinal axis. A cross-sectional dimension of the nanostructures preferably lies in the region of 1 to 500 nanometers. According to preferred embodiments, nanostructures, such as e.g. carbon nanotubes (CNT) or inorganic nanostructures, such as e.g. semiconducting nanowires (e.g. silicon nanowires) are included.

The term "co-deposition" means that two or more elements are deposited at a same time, e.g. from a same bath, to respectively form an alloy or a composite. Different aspects and types of "co-deposition" are known in state of the art and described e.g. in "Electrochemical and Materials Science Aspects of Alloy Deposition", D. Landolt, Electrochimica Acta, Vol. 39, 1075-1090, 1994.

The preferred embodiments relate to a method to provide mono-crystalline nanostructures. The preferred embodiments further relate to doped single-crystal nanostructures wherein the concentration of the dopant elements within the nanostructure is very well controllable. Using the method of the preferred embodiments it is possible to control the concentration of dopant elements in the nanostructure in the range of $10^{13}/cm^3$ up to $10^{21}/cm^3$.

The preferred embodiments further relate to a method to provide a novel and easy growth method to provide segmented nanostructures or in other words a nanostructure having at least two segments.

The methods of the preferred embodiments make use of templated electrochemical deposition (ECD) and metal-mediated crystallization (MMC).

In one aspect, a method is provided for mono-crystalline nanostructures onto a substrate.

The method comprises at least the steps of:
first providing a pattern onto a main surface of the substrate wherein the pattern has at least one opening, the opening extending from the surface of the pattern to the main surface of the substrate,
providing a metal into the at least one opening of the pattern,
at least partly filling the at least one opening with amorphous material, and
annealing the substrate at temperatures between 300° C. and 1000° C. thereby transforming the amorphous material into mono-crystalline material by metal mediated crystallization to form a mono-crystalline nanostructure, and
optionally removing the metal compound and/or pattern.

The mono-crystalline nanostructures formed by the method according to preferred embodiments may advantageously be used with any size of substrate and are fully compatible with semiconductor processing technology.

FIGS. 1A to 1E illustrate subsequent steps in a method according to preferred embodiments for growing mono-crystalline nanostructures onto a substrate.

Figure 1A:
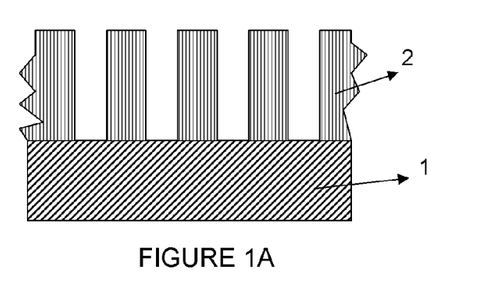
FIGS. 1A to 1F illustrate subsequent steps in a method for growing mono-crystalline nanostructures onto a substrate.

As illustrated in FIG. 1A in a first step, a substrate 1 is provided. According to preferred embodiments, the substrate 1 can be conductive or semi-conductive in which case Electrochemical Deposition (ECD) by electrolytic means is used to deposit the metal in a subsequent step. Therefore, according to preferred embodiments, the substrate 1 may be a metallic substrate or a semi-conductive substrate such as silicon (Si), germanium (Ge) or e.g. made of a group III/V semi-conductive material. The substrate 1 can be insulating, conductive or semi-conductive in which case Electrochemical Deposition (ECD) by electroless means or vapour deposition techniques are used to deposit the metal. Vapour deposition techniques include Physical Vapour Deposition (PVD), Chemical Vapour Deposition (CVD) and derivates such as Atomic Layer Deposition (ALD).

Onto the substrate 1, a pattern 2 is formed wherein the pattern 2 has at least one opening, the opening extending to the main surface of the substrate. The openings extending to the surface of the substrate are preferably in the nanometer range, more preferably in the range of 2 nm up to 100 nm. The pattern may be a permanent pattern 2 or alternatively a sacrificial pattern 2.

The pattern 2 may be a porous pattern such as Anodized Aluminum Oxide (AAO), an oriented zeolite or holes formed in a dielectric layer, e.g. $SiO_2$, a photoresist pattern, etc.

According to preferred embodiments, the step of providing the pattern 2 may be performed by first depositing a layer and subsequently patterning at least one opening in the deposited layer to form the pattern 2 as shown in FIG. 1A. The openings in the deposited layer may be formed using standard semiconductor processes, such as e.g. a combination of lithography and dry etching, e.g. anisotropic dry etching. Standard lithographic processing may at least comprise depositing at least one photosensitive layer, for example a photoresist layer, and optionally an antireflective coating on top of or underneath the deposited layer and developing the at least one photosensitive layer to create a photolithographic pattern. In case an antireflective coating is provided on top of the deposited layer, this anti-reflective coating can be selected to be easily removable during the lithography processing. The photolithographic pattern is then used as a mask in e.g. reactive ion etching to form openings in the deposited layer, thereby exposing parts of a main surface of the substrate 1.

According to preferred embodiments, the deposited layer can be a silicon oxide layer, e.g. a $SiO_2$ layer which may, for example, be formed by Chemical Vapour Deposition (CVD). According to other preferred embodiments, the deposited layer may be an organic spin-on material such as, for example, commonly used polymer resist materials for lithography (e.g. PMMA (poly-methyl methacrylate)) or an organic low-k dielectric material such as e.g. SiLk®. The thickness of the deposited layer depends on the application and on the size, more particularly height of the mono-crystalline nanostructure to be formed. The thickness of the deposited layer may, for example, be in the range of between 10 nm and 100 μm and more specifically between 100 nm and 1 μm for CMOS applications.

Figure 1B:
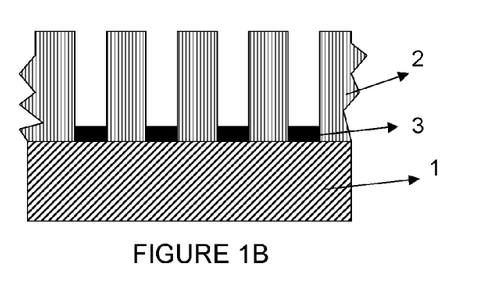

After forming openings in the deposited layer to achieve the pattern 2, the substrate 1 may be immersed in an electrolytic bath to perform deposition of the metal. This may, for example be done by Electrochemical Deposition (ECD) by electroless means or electrolytic means. During the deposition process, the bottom of the openings in the pattern 2 is covered with the metal 3. FIG. 1B illustrates the pattern having openings in which the bottom of the openings is covered with the metal 3.

According to preferred embodiments, the metal 3 is such that metal-mediated crystallization of amorphous material is possible. Suitable metals are e.g. Au, Ni, Co, Fe, Al, In, Ga, Ti, or the like. Au particles may be deposited starting from an Au(I) solution (e.g. 0.01M $Na_3Au(S_2O_3)_2$) in an electrolyte, e.g., 0.1M $Na_2S_2O_3$, 0.1M $Na_2SO_3$, 0.3M $Na_2HPO_4$.

Alternatively, also metal alloys may be considered. These metal alloys may be deposited into the openings of the pattern 2 using electrochemical co-deposition.

According to preferred embodiments, the metal 3 may contain dopant elements. These dopant elements are chosen to dissolve into the amorphous material 4 during the subsequent Metal Mediated Crystallization (MMC) step thereby achieving a doped crystalline nanostructure 5 after annealing. The metal containing a predetermined amount of dopant elements may be deposited into the openings of the pattern 2 using electrochemical co-deposition. As known by a person skilled in the art, electrochemical co-deposition of the metal 3 and the dopant element, having standard potentials that are far apart can lead to a large difference in deposition rates of the two materials. Details of co-deposition processes are described e.g. in "Electrochemical and Materials Science Aspects of Alloy Deposition", D. Landolt, Electrochimica Acta, Vol. 39, 1075-1090, 1994.

Figure 1C:
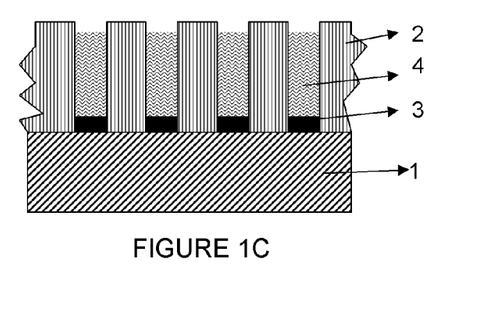

In a next step of a method according to preferred embodiments, which is illustrated in FIG. 1C, amorphous material 4 is deposited onto the metal 3 to fill at least partly the openings. According to preferred embodiments the step of at least partly filling the opening with amorphous material 4 is performed using electrochemical deposition (ECD). The amorphous material 4 may be amorphous Si (a-Si), amorphous Ge (a-Ge), amorphous InSb (a-InSb), amorphous carbon (a-C). Ge and Si are typically electrodeposited from organic solutions while InSb is typically electrodeposited from aqueous solutions.

InSb may be deposited using electrochemical deposition starting from a solution of 0.025M $InCl_3$, 0.025M $SbCl_3$, 0.2M citric acid and 0.06M sodium citrate at a pH around 2.2. Amorphous InSb deposits (1:1 In:Sb ratio) in hole patterns at deposition potentials between −0.8V and −1.45V versus the Ag/AgCl reference electrode for a deposition charge of −50 $mC/cm^2$ for 330 nm holes.

According to preferred embodiments, the amorphous material 4 may contain dopant elements. Preferably incorporation of the dopant element in the amorphous material 4 is performed by co-deposition of the dopant element and the amorphous material 4. Typically P, As, Sb or Bi are used as dopant elements to achieve an n-type doped (Si) material and B, Al, Ga and In are used as dopant elements to achieve a p-type doped (Si) material.

To achieve a variation in dopant concentration in a nanostructure according to preferred embodiments, first the amorphous material 4 (e.g. amorphous Si) containing dopant elements, e.g. containing P, is co-deposited in a predetermined thickness, e.g. 50 nm, followed by the deposition of the amorphous material 4 in a predetermined thickness, e.g. 150 nm, without any dopant elements. A doping "profile" may be achieved during the crystallization step of the preferred embodiments and/or by performing a further (additional) annealing step after the crystallization step to achieve a doping profile.

Figure 1D:
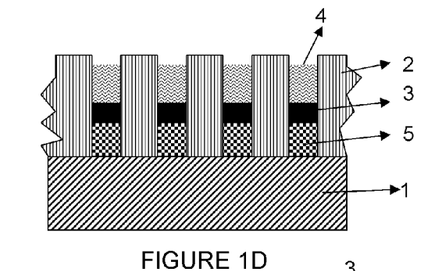
Figure 1E:
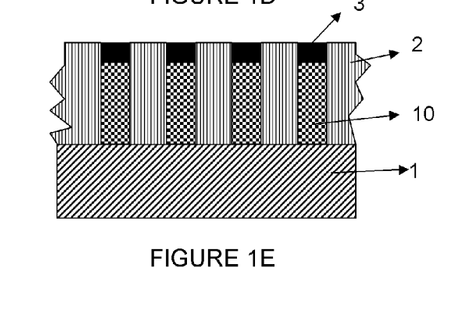
Figure 1F:
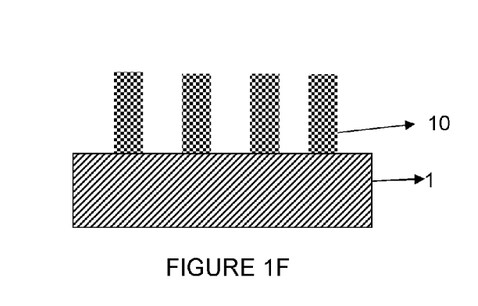

As illustrated in FIG. 1D and FIG. 1E the substrate 1 is annealed at temperatures between 300° C. and 1000° C., depending on metal used for MMC, to achieve metal mediated crystallization of the amorphous material 4 to form crystallized material 5. For example, a temperature in the range 300° C.-400° C. may be used for low-melting point metals such as In and Ga, a temperature in the range 500° C.-600° C. for metals such as Ni, Fe and Co and a temperature in the range 900° C.-1000° C. for transition metals such as Ti. The annealing is preferably performed for approximately 1 hour in inert or reducing atmosphere or in a vacuum. According to preferred embodiments, the annealing step may be performed by a Rapid Thermal Anneal. Annealing the amorphous material converts the amorphous material 4 into crystalline material 5 by diffusion of the amorphous material into the metal compound. Crystallization is happening by segregation and in the crystallization process the metal phase moves through the amorphous phase 4 leaving behind a crystallized phase 5 until the metal finally ends up on top. When the pore size or diameter of the opening is small compared to typical grain sizes obtained by the bulk MMC conditions, the crystallized phase will be single crystalline. The MMC process whereby the pore walls or diameter of the openings confine the crystal is defined as constrained MMC. FIG. 1D illustrates the intermediate state during anneal showing the crystallized material 5 at the bottom, the metal compound in the middle and the amorphous material 4 on top. One could stop here when such intermediate structure is desired. FIG. 1E illustrates the crystallized material 5 after full crystallization of the amorphous material 4, the obtained nanostructure is single crystalline and the metal 3 is situated on top of the crystallized material 5. The metal 3 can be removed when desired. The pattern 2 can also be removed when desired to form the free-standing mono-crystalline nanostructures 10 as illustrated in FIG. 1F.

Figures 2, 2B:
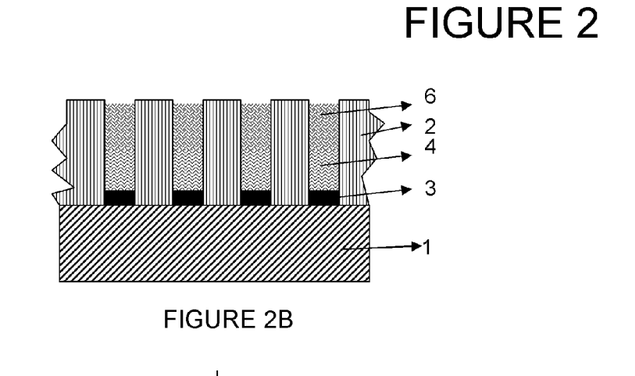
FIGS. 2A to 2D illustrates subsequent steps in a method for growing segmented crystalline nanostructures onto a substrate.

As illustrated in FIG. 2, the method of the preferred embodiments can also be used for growing crystalline segmented nanostructures e.g. having a first segment made of a first monocrystalline material 5 and a second segment made of a second monocrystalline material 6 such that nanostructures suitable for junctions can be created. According to a first processing method and as illustrated in FIG. 2A up to 2D onto the first amorphous material 4 the remaining part of the opening is filled with a second amorphous material 6 to achieve the second segment made of a second monocrystalline material 8.

Figure 2A:
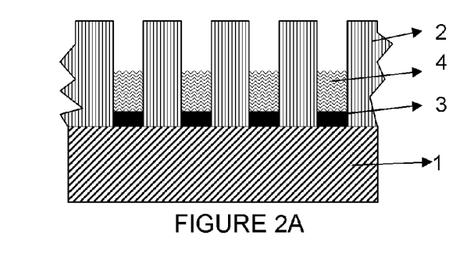

As illustrated in FIG. 2A, after depositing the metal 3 as described above, the openings of the pattern 2 are only partly filled with a first amorphous material such as a-Si, a-Ge, a-InSb, a-C preferably using ECD techniques, low temperature PVD or CVD, as described above. To deposit a-C, plasma enhanced CVD can give amorphous phases at relatively low T. This first amorphous material 4 may be mixed with a small percentage of dopant elements such as P, As, Sb, Bi as n-type dopants for Si and Ge, or B, Al, Ga as p-type dopants for Si and Ge, preferentially by electrochemical co-deposition. The metal to be used may be a single metal in case the metal is suitable to achieve MMC within the first and second amorphous material 4,6. In case the metal to be used to achieve MMC within the first and second amorphous material 4,6 is different, a metal alloy compound made of at least two different metals can be used whereby one metal is used to achieve MMC within the first amorphous material 4 and another metal is used to achieve MMC within the second amorphous material 6.

As illustrated in FIG. 2B, the remaining part of the openings in the pattern is filled with a second amorphous material 6 different from the first amorphous material 4. The second amorphous material 6 may be different from the first amorphous material 4 either in material and/or doping. For example the second amorphous material 6 may be the same as the first amorphous material but with small percentage of the opposite dopant elements, or the same dopant elements but in different concentration, or no dopant elements to make an intrinsic part. Alternatively the second amorphous material may be a different amorphous material with or without incorporated dopant elements such that hetero junctions can be created.

Figure 2C:
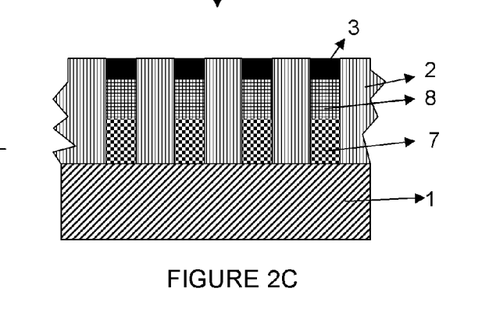

As illustrated in FIG. 2C the amorphous material 4,6, and the metal 3, are then annealed at temperatures between 300° C. and 1000° C., depending on metal used for MMC, to achieve metal mediated crystallization of the first and second amorphous material 4,6 to respectively form a first crystallized material 7 and a second crystallized material 8.

Figure 2D:
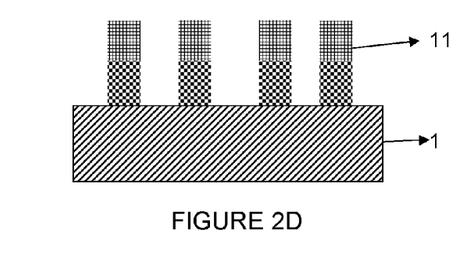

FIG. 2D illustrates the crystallized first and second amorphous material 4,6 after full crystallization into single crystal structures 7,8. The obtained nanostructure is a segmented mono-crystalline nanostructure. The metal compound 3, which was situated on top of the crystallized material 8, may be removed as well as the pattern 2 to form the free-standing segmented mono-crystalline nanostructures 11 as illustrated in FIG. 2D.

Figures 3, 3C:
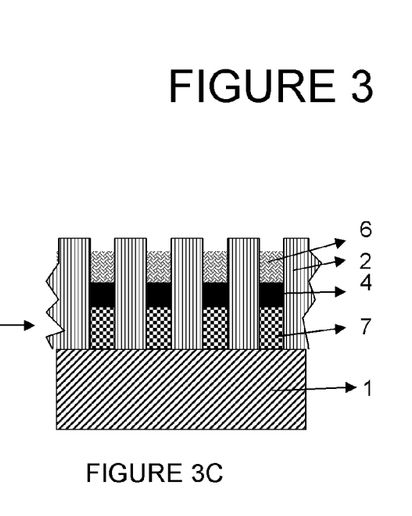
FIGS. 3A to 3E illustrates subsequent steps in an alternative method for growing segmented crystalline nanostructures onto a substrate.
Figure 3A:
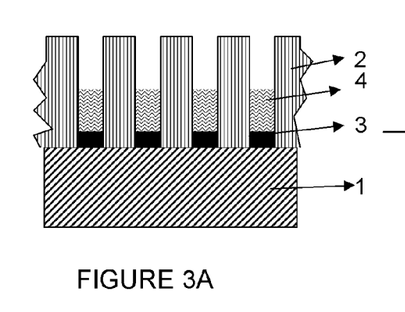

An alternative processing method for growing crystalline segmented nanostructures, e.g., having a first segment made of a first monocrystalline material 5 and a second segment made of a second monocrystalline material 6 is illustrated in FIG. 3A up to 3E. This alternative method differs from the previously mentioned method in the fact that the first amorphous material 4 is crystallized before the second amorphous material 6 is deposited.

As illustrated in FIG. 3A, after depositing the metal 3 as described above, the openings of the pattern 2 is only partly filled with a first amorphous material such as a-Si, a-Ge, a-InSb, a-C preferably using ECD or other low temperature deposition techniques as described above. This first amorphous material 4 may be mixed with a small percentage of dopant elements such as P, As, Sb, Bi as n-type dopant elements for Si and Ge, or B, Al, Ga as p-type dopant elements for Si and Ge, preferentially by electrochemical co-deposition.

Figure 3B:
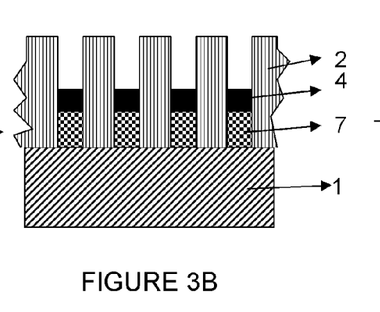

As illustrated in FIG. 3B the amorphous material 4 and the metal 3, are then annealed at temperatures between 300° C. and 1000° C. (depending on metal used for MMC) to achieve metal mediated crystallization of the first amorphous material 4 to form a first crystallized material 7.

In case the metal 3 used to achieve MMC within the first amorphous material 4 is also used to achieve MMC within the second amorphous phase, the metal 3 can remain. In case the metal 3 is not used to achieve MMC within the second amorphous material 6, a new metal is deposited on the formed first segment after removal of the first metal from the first segment. Alternatively, the metal is a metal alloy made of at least two different metals wherein the first metal is used to create MMC within the first amorphous material 4 and the second metal is used to create MMC within the second amorphous material 6.

As illustrated in FIG. 3C, the remaining part of the openings in the pattern is filled with a second amorphous material 6 different from the first amorphous material 4. The second amorphous material 6 may be different from the first amorphous material 4 either in material and/or doping. For example the second amorphous material 6 may be the same as the first amorphous material but with small percentage of opposite dopant elements, or the same dopant elements but in different concentration, or no dopant elements to make an intrinsic part. Alternatively the second amorphous material may be a different amorphous material with or without incorporated dopant elements such that hetero junctions can be created.

Figure 3D:
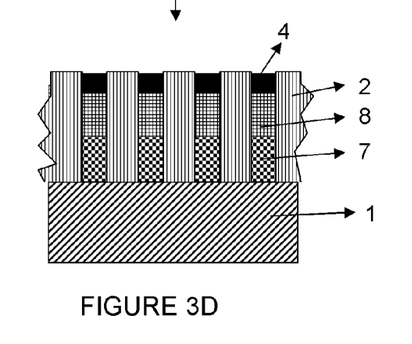

As illustrated in FIG. 3D the amorphous material 6, and the metal compound 3, is then annealed at temperatures between 300° C. and 1000° C. (depending on metal used for MMC) to achieve metal mediated crystallization of the second amorphous material 6 to form the second crystallized material 8.

Figure 3E:
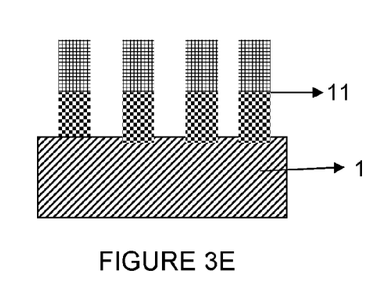

FIG. 3E illustrates the crystallized first and second amorphous material 4,6 after full crystallization into single crystal structures 7,8. The obtained nanostructure is a segmented mono-crystalline nanostructure. The metal compound 3, which was situated on top of the crystallized material 8, may be removed as well as the pattern 2 to form the free-standing segmented mono-crystalline nanostructures 11 as illustrated in FIG. 3E.

It is to be understood that although preferred embodiments, specific constructions and configurations, as well as materials, have been discussed herein for devices according to the present invention, various changes or modifications in form and detail may be made without departing from the scope of this invention as defined by the appended claims.

All references cited herein are incorporated herein by reference in their entirety. To the extent publications and patents or patent applications incorporated by reference contradict the disclosure contained in the specification, the specification is intended to supersede and/or take precedence over any such contradictory material.

What is claimed is:

1. A method for growing crystalline nanostructures onto a substrate, the method comprising:
   providing a pattern on a main surface of the substrate, wherein the pattern has at least one opening, the opening extending from a surface of the pattern to the main surface of the substrate, and wherein at least a portion of the main surface of the substrate is exposed;
   providing a metal in the opening of the pattern on the exposed main surface;
   at least partly filling the opening with an amorphous material, and
   annealing the amorphous material and the metal at a temperature of from about 300° C. to about 1000° C., thereby transforming at least a part of the amorphous material into crystalline material by metal mediated crystallization to form a crystalline nanostructure.

2. The method of claim 1, wherein the substrate is selected from the group consisting of a conductive material, a metallic material, a semiconductive material, and combinations thereof, and wherein providing the metal comprises applying electrochemical deposition by electrolytic means.

3. The method of claim 2, wherein the semiconductive material is selected from the group consisting of silicon, germanium, a group III-V semiconductor, and combinations thereof.

4. The method of claim 1, wherein the substrate is selected from the group consisting of a conductive material, a semiconductive material, an insulating material, and combinations thereof, and wherein providing the metal comprises use of at least one technique selected from the group consisting of electrochemical deposition by electroless means, chemical vapor deposition, and physical vapor deposition techniques.

5. The method of claim 1, wherein the pattern is a porous pattern selected from the group consisting of anodized alumina oxide and an oriented zeolite, wherein the opening has a diameter of from about 2 nm to about 100 nm.

6. The method of claim 1, wherein providing a pattern is performed by:
   depositing a layer on a main surface of the substrate; and thereafter
   forming a pattern having at least one opening into the deposited layer using at least lithographic patterning, wherein the opening has a diameter of from about 2 nm to about 100 nm.

7. The method of claim 1, wherein the crystalline nanostructure is a monocrystalline nanostructure, wherein the pattern is a sacrificial pattern, and wherein the method further comprises removing the pattern after formation of the monocrystalline nanostructure.

8. The method of claim 1, wherein the metal further comprises at least one dopant element which dissolves into the amorphous material during annealing to form a doped monocrystalline nanostructure.

9. The method of claim 1, wherein the substrate is selected from the group consisting of a conductive material, a semiconductive material, and combinations thereof, and wherein the step of at least partly filling the opening with an amorphous material is performed using electrochemical deposition.

10. The method of claim 1, wherein the amorphous material is selected from the group consisting of amorphous silicon, amorphous germanium, amorphous InSb, amorphous carbon, and combinations thereof.

11. The method of claim 1, wherein at least partly filling the opening with an amorphous material is performed by co-deposition of a dopant element and the amorphous material, thereby forming a doped amorphous material, and wherein the crystalline nanostructure is a doped monocrystalline nanostructure.

12. The method of claim 11, wherein the doped monocrystalline nanostructure has a variation in dopant concentration, and wherein at least partly filling the opening with doped amorphous material comprises first depositing a doped amorphous material having a predetermined thickness and thereafter depositing an undoped amorphous material having a predetermined thickness.

13. The method of claim 1, wherein the crystalline structure is a monocrystalline structure that comprises a first segment and a second segment, wherein the first segment is a first amorphous material, wherein the second segment is a second amorphous material, and wherein the first amorphous material is different from the second amorphous material, the method further comprising, after partly filling the opening with the first amorphous material, a step of at least partly filling a remaining unfilled part of the opening with the second amorphous material.

14. The method of claim 13, wherein the first amorphous material and the second amorphous material are annealed during a same anneal step to respectively form the first segment and the second segment.

15. The method of claim 13, wherein before the step of partly filling a remaining unfilled part of the opening with the second amorphous material, the first amorphous material is annealed to form the first segment.

16. The method of claim 15, wherein, after forming the first segment, a different metal compound is provided on top of the first segment.

17. The method of claim 1, wherein the crystalline nanostructure is a part of a semiconductor device.

* * * * *